(12) United States Patent
Saito et al.

(10) Patent No.: US 6,288,910 B1
(45) Date of Patent: Sep. 11, 2001

(54) TRANSMIT-RECEIVE UNIT

(75) Inventors: Yoshio Saito; Satoshi Urabe, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/522,568

(22) Filed: Mar. 10, 2000

(30) Foreign Application Priority Data

Mar. 15, 1999 (JP) .................................................. 11-069140

(51) Int. Cl.⁷ ...................................................... H05K 7/14
(52) U.S. Cl. .......................... 361/799; 361/753; 361/752
(58) Field of Search ..................................... 361/752, 753, 361/799, 816, 818, 801, 802, 803, 212, 220, 796, 800, 600, 601, 641, 644; 174/35 R, 35 GC, 51, 52.1, 50; 312/223.1, 223.2; 206/706, 709

(56) References Cited

U.S. PATENT DOCUMENTS 5,373,101 * 12/1994 Barabolak ........................ 174/35 R

FOREIGN PATENT DOCUMENTS 8-102592   4/1996 (JP) .
9-107192   4/1997 (JP) .

* cited by examiner

Primary Examiner—Jeffrey Gaffin
Assistant Examiner—Phuong T. Vu
(74) Attorney, Agent, or Firm—Brinks Hofer Gilson & Lione

(57) ABSTRACT

Since the transmit-receive unit of the prior art comprises the housing 21 made from a metal, the weight of the housing is large and the obtained transmit-receive unit for use in a portable telephone which is required to be light in weight becomes heavy. A transmit-receive unit comprises a housing which is made from a synthetic resin and has a conductive surface layer. Therefore, the housing is lighter in weight than a housing made from a metal of the prior art and makes it possible to provide a lightweight transmit-receive unit suitable for use in a portable telephone.

3 Claims, 2 Drawing Sheets

TRANSMIT-RECEIVE UNIT

BACKGROUND OF THE INVENTION

1. Field of the Invention

The present invention relates to a transmit-receive unit suitable for use in a portable telephone.

2. Description of the Related Art

A prior art transmit-receive unit will be described with reference to FIG. 4. A housing 21 made of a metal plate is shaped like a frame which is open at the top and the bottom and has a storage portion 21b defined by four side walls 21a and installation feet 21c provided at the bottom.

Various electric parts 23 for forming a transmitting and receiving circuit are mounted on both sides of a circuit board 22 which is a printed board, stored in the storage portion 21b of the housing 21 and fixed to side walls 21a.

A pair of covers 24 and 25 are made of a metal plate and the cover 24 is attached to the housing 21 to cover the upper open portion of the housing 21 and the cover 25 is attached to the housing 21 to cover the lower open portion of the housing 21 so as to electrically shield up the inside of the housing 21.

The transmit-receive unit constituted as described above is installed on a mother board 26 in such a manner that the installation feet 21c of the housing 21 are placed on a mother board 26 and soldered to an earth pattern (not shown) provided on the mother board 26 and the covers 24 and 25 are grounded to the earth pattern through the side walls 21a of the housing 21.

However, since the transmit-receive unit of the prior art comprises the housing 21 made from a metal, the weight of the housing is large and the obtained transmit-receive unit for use in a portable telephone which is required to be light in weight becomes heavy.

Further, since the two covers 24 and 25 are used, their assembly is troublesome, thereby reducing productivity and boosting costs.

SUMMARY OF THE INVENTION

According to a first aspect of the present invention, there is provided a transmit-receive unit which comprises a housing shaped like a box and having a storage portion defined by a bottom wall and four side walls, a circuit board having electric parts on both sides, and a metal cover shaped like a box, wherein the housing is made from a synthetic resin and has a conductive surface layer, the circuit board is installed in the housing, the electric parts arranged on one side of the circuit board are stored in the storage portion of the housing and shield by the housing, and the electric parts arranged on the other side of the circuit board are covered by the cover and shield by the cover.

According to a second aspect of the present invention, there is provided a transmit-receive unit having an earth plate which is made of a metal plate, laid over the side wall of the housing while it is electrically connected to the cover and drawn to the under surface of the housing.

According to a third aspect of the present invention, there is provided a transmit-receive unit, wherein the earth plate has an elastic tongue-like piece in a portion drawn to the under surface of the housing.

According to a fourth aspect of the present invention, there is provided a transmit-receive unit, wherein the circuit board has a conductive pattern and the earth plate is soldered to the conductive pattern and the cover.

BRIEF DESCRIPTION OF THE ACCOMPANYING DRAWINGS

DETAILED DESCRIPTION OF THE PREFERRED EMBODIMENT

Figure 1:
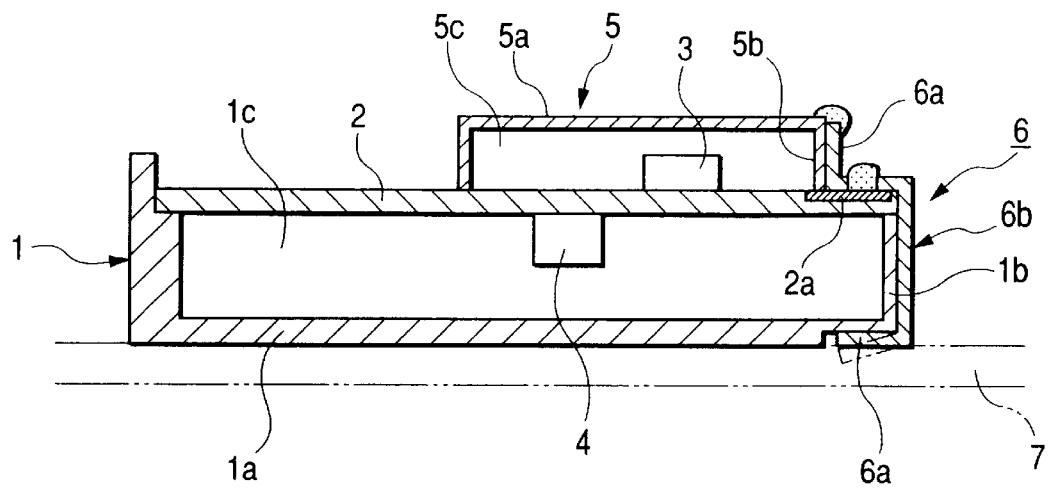
FIG. 1 is a sectional view of the transmit-receive unit of the present invention.

The transmit-receive unit of the present invention will be described with reference to FIGS. 1 to 3. FIG. 1 is a sectional view of the transmit-receive unit of the present invention, FIG. 2 is a plan view of key parts of the transmit-receive unit of the present invention, and FIG. 3 is a perspective view of an earth plate for the transmit-receive unit of the present invention.

Figure 2:
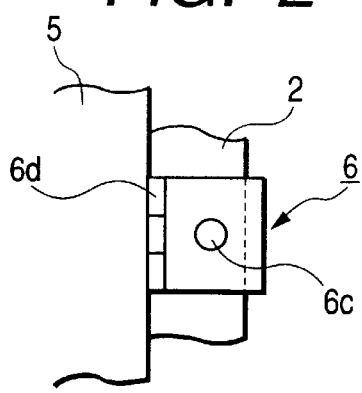
FIG. 2 is a plan view of key parts of the transmit-receive unit of the present invention.
Figure 3:
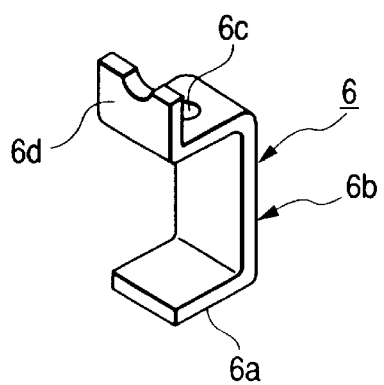
FIG. 3 is a perspective view of an earth plate for the transmit-receive unit of the present invention.
Figure 4:
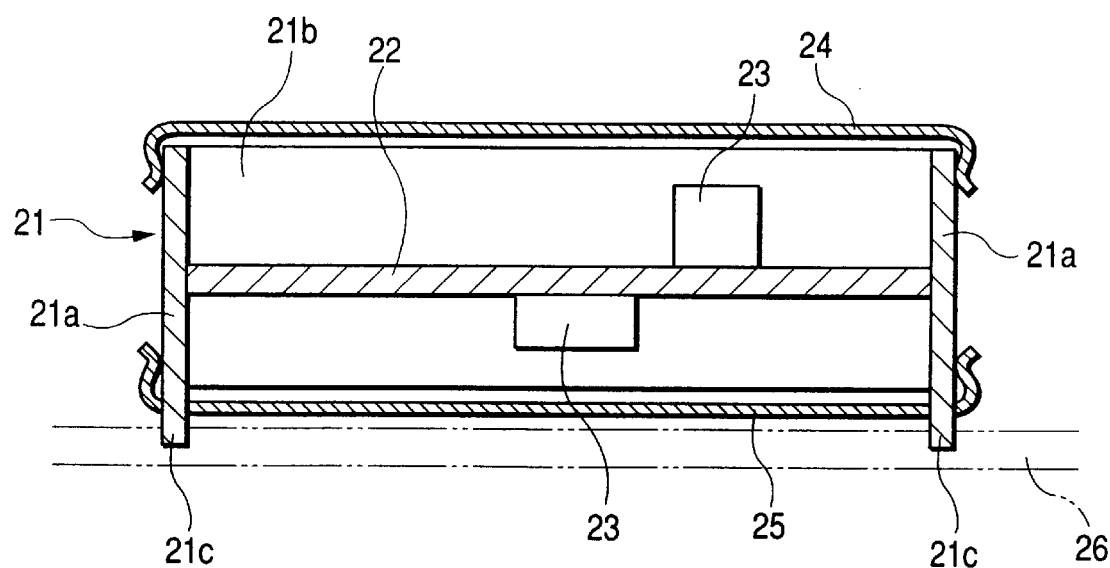
FIG. 4 is a sectional view of the transmit-receive unit of the prior art.

Describing the transmit-receive unit of the present invention with reference to FIGS. 1 to 3, a housing 1 formed of a synthetic resin molded product has a bottom wall 1a, side walls 1b provided on the four sides of the bottom wall 1a and a storage portion 1c defined by the bottom wall 1a and the side walls 1b and open at the top. A conductive layer (not shown) formed by plating a metal is formed on the entire surface of the housing 1.

Various electric parts 3 and 4 constituting a transmitting and receiving circuit are arranged on both sides of a circuit board 2 having a conductive pattern 2a which is a printed board. This circuit board 2 is installed in the housing 1 in such a manner that it covers the top open portion of the housing 1 and the electric parts 4 arranged on the under surface of the circuit board 2 are stored in the storage portion 1c to be electrically shield.

A cover 5 made of a metal plate is shaped like a box and has an upper wall 5a, side walls 5b formed on the four sides of the upper wall 5b and a storage portion 5c defined by the upper wall 5a and the side walls 5b. This cover 5 is installed on the housing 1 in such a manner that it covers the transmitting and receiving circuit including the electric parts 3 arranged on the top surface of the circuit board 2 so that the electric parts 3 are electrically shield by this cover 5.

An earth plate 6 made of a metal plate has a U-shaped portion 6b whose lower portion is an elastic tongue-like piece 6a, a hole 6c formed in the upper portion of the U-shaped portion 6b and a bent piece 6d bent from the upper potion of the U-shaped portion 6b almost at a right angle.

This earth plate 6 is installed such that the circuit board 2 and the bottom wall 1a are held by the upper portion and the elastic tongue-like piece 6a which is the lower piece portion of the U-shaped portion 6b, the side piece portion of the earth plate 6 is laid over the side wall 1b, the elastic tongue-like piece 6a of the earth plate 6 is drawn to the under surface of the housing 1, the bent piece 6d is brought into contact with the side wall 5b of the cover 5, the bent piece 6d and the side wall 5b are soldered together, and the earth plate 6 and the earth portion of the conductive pattern 2a are soldered together at the position of the hole 6c.

This transmit-receive unit is constructed such that the housing 1 is mounted on the mother board 7 in such a manner that the elastic tongue-like piece 6a gets in elastic contact with the earth pattern (not shown) of the mother board 7 and the earth pattern of the mother board 7 is soldered to the elastic tongue-like piece 6a to install the housing I on the mother board 7.

The cover 5 is grounded to the earth pattern of the mother board 7 through the earth plate 6 and the earth portion of the conductive pattern 2a of the circuit board 2 is also grounded.

Since the housing 1 of the transmit-receive unit of the present invention is made from a synthetic resin and has a conductive surface layer, the housing 1 is lighter than the metal housing of the prior art and a lightweight transmit-receive unit suitable for use in a portable telephone can be provided.

Since the circuit board 2 is installed in the housing 1 and the electric parts 4 arranged on one side of the circuit board 2 are stored in the storage portion 1c of the housing 1 and shield by the housing 1, two covers are not necessary unlike the prior art, thereby making it possible to provide an inexpensive transmit-receive unit having excellent assembly efficiency.

The earth plate 6 is made of a metal plate and laid over the side wall 1b of the housing 1 while it is electrically connected to the cover 5 and drawn to the under surface of the housing 1. Therefore, the earth plate 6 can be grounded to the mother board 7 together with the conductive layer of the housing 1, thereby making it possible to provide a transmit-receive unit which is grounded without fail.

Since the earth plate 6 has the elastic tongue-like piece 6a in a portion drawn to the under surface of the housing 1, when the housing 1 is installed on the mother board 7, the elastic tongue-like piece 6a gets in elastic contact with the earth pattern of the mother board 7, thereby making it possible to provide a transmit-receive unit which facilitates soldering work. Since the elastic tongue-like piece 6a is located on the under surface of the bottom wall 1a of the housing 1, the housing 1 is held by the U-shaped portion 6b to provisionally locate the earth plate 6 and the space factor of the elastic tongue-like piece 6a is high, thereby making it possible to provide a small-sized transmit-receive unit.

Since the circuit board 2 has the conductive pattern 2a, and the earth plate 6 is soldered to the conductive pattern 2a and the cover 5, a transmit-receive unit which can be grounded from the cover 5 without fail can be provided.

What is claimed is:

1. A transmit-receive unit comprising:

a housing shaped like a box and having a storage portion defined by a bottom wall and four side walls;

a circuit board having electric parts on both sides;

a metal cover shaped like a box; and an earth plate made of a metal plate and arranged over one of the side walls of the housing, the earth plate electrically connected with the cover and drawn to an under surface of the housing;

wherein the housing is made from a synthetic resin and has a conductive surface layer, the circuit board is installed in the housing, the electric parts arranged on one side of the circuit board are stored in the storage portion of the housing and shielded by the housing, and the electric parts arranged on the other side of the circuit board are covered by the cover and shielded by the cover.

2. The transmit-receive unit of claim 1, wherein the earth plate has an elastic piece shaped like a tongue in a portion drawn to the under surface of the housing.

3. The transmit-receive unit of claim 1, wherein the circuit board has a conductive pattern and the earth plate is soldered to the conductive pattern and the cover.

* * * * *